United States Patent [19]

Ehrfeld et al.

[11] Patent Number: 4,703,559
[45] Date of Patent: Nov. 3, 1987

[54] METHOD FOR PRODUCING CONNECTING ELEMENTS FOR ELECTRICALLY JOINING MICROELECTRONIC COMPONENTS

[75] Inventors: Wolfgang Ehrfeld, Karlsruhe; Peter Hagmann, Eggenstein-Leopoldshafen; Dietrich Münchmeyer, Stutensee-Spöck; Erwin W. Becker, Karlsruhe, all of Fed. Rep. of Germany

[73] Assignee: Kernforschungszentrum Karlsruhe GmbH, Karlsruhe, Fed. Rep. of Germany

[21] Appl. No.: 793,970

[22] Filed: Nov. 1, 1985

[30] Foreign Application Priority Data

Nov. 2, 1984 [DE] Fed. Rep. of Germany ....... 3440110
Nov. 2, 1984 [DE] Fed. Rep. of Germany ....... 3440109

[51] Int. Cl.$^4$ ............................................. H01R 43/00
[52] U.S. Cl. ..................................... 29/854; 174/68.5; 430/315
[58] Field of Search ................. 29/854, 852; 174/68.5; 430/315, 319, , 329

[56] References Cited

U.S. PATENT DOCUMENTS

| | | | |
|---|---|---|---|
| 3,832,769 | 9/1974 | Olyphant, Jr. et al. | 174/68.5 X |
| 3,953,924 | 5/1976 | Zachry et al. | 174/68.5 X |
| 3,967,162 | 6/1976 | Ceresa et al. | 174/68.5 X |
| 4,050,756 | 9/1977 | Moore . | |
| 4,067,104 | 1/1978 | Tracy | 29/854 |
| 4,336,551 | 6/1982 | Fujita et al. | 174/68.5 X |
| 4,393,129 | 7/1983 | Glashauser et al. . | |
| 4,404,059 | 9/1983 | Livshits et al. | 174/68.5 X |

FOREIGN PATENT DOCUMENTS

| | | |
|---|---|---|
| 3039110 | 5/1982 | Fed. Rep. of Germany . |
| 1379558 | 1/1975 | United Kingdom .................. 29/852 |

OTHER PUBLICATIONS

Prof. Dr. rer. nat. Peter Kästner, "Halbleiter-Technologie" (Semiconductor Technology), Vogel-Verlag, Würtzburg, 1980, pp. 88-89.
L. S. Goldman and P. A. Totta, "Area Array Solder Interconnections for VLSI", Solid States Technology, vol. 26, Jun. 1983, pp. 91-97.
A. Keil, W. A. Merl, and E. Vinaricky, "Electrical Contacts and Their Materials", Springer Verlag, 1984, p. 317 et seq.
K. I. Puttlitz, "Chip Replacement by Hot-Gas Site Dressing", Solid States Technology, Nov. 1980, pp. 48-50.

Primary Examiner—P. W. Echols
Assistant Examiner—Carl J. Arbes
Attorney, Agent, or Firm—Spencer & Frank

[57] ABSTRACT

Method for producing a plurality of deformable connecting elements for electrically joining microelectronic components. The method includes irradiating with high energy radiation portions of a plate-like member composed of material having a material characteristic which is changed by such high energy radiation, each portion having dimensions corresponding to those of a connecting element; utilizing the changed material characteristic of the material of the irradiated portions to remove such material from the irradiated portions to produce a plate-like mold containing a plurality of mold structures each defining a shape corresponding to a connecting element at a given location of said member, each such mold structure having lateral dimensions and a height dimension which is a multiple of the smallest lateral dimension; filling the mold structures with metal by electroplating the metal into such mold structures to produce metallic connecting elements; fixing the connecting elements to a microelectronic component; and removing the plate-like mold.

21 Claims, 20 Drawing Figures

METHOD FOR PRODUCING CONNECTING ELEMENTS FOR ELECTRICALLY JOINING MICROELECTRONIC COMPONENTS

BACKGROUND OF THE INVENTION

It is known in the production of microcontacts on a monolithically integrated microcircuit (chip) to connect the contact locations on the chip with one end of thin metal wires and to join electrodes to be connected to the chip with the other end of the thin metal wires by means of thermocompression or rubbing, thus producing deformable multiconnections (see, for example, Kästner, *Halbleiter-Technologie [Semiconductor Technology]*, published by Vogel-Verlag, Würzburg, 1980, pages 88,89). The joining electrodes may be spaced much farther apart on the chip substrate than the contact locations on the chip. The joining electrodes can thus be produced as plug-in contacts Although this results in a plug-in component which can easily be installed in or removed from a larger electronic switching unit, the installation surface required for this purpose still is a multiple of the chip surface.

It is also known to distribute the contact locations over the entire chip surface and to solder the contact locations of a plurality of chips directly onto a common ceramic substrate which contains the connecting conductors in several layers, this being known as "flip-chip bonding", as described, for example, by L. S. Goldman and P. A. Totta in an article entitled "Area Array Solder Interconnections for VLSI" in *Solid State Technology*, Volume 26, No. 6, 1983, pages 91-97. Using this technique, it is possible to realize significantly greater integration densities and significantly shorter signal delay times than with other installation methods. Because, the rear sides of the chips are free of mechanical or electrical structures in this installation method, there arises the additional possibility of cooling the rear sides with water in pressed-on metal cylinders.

The direct soldering of the chips onto the ceramic substrate, however, results in even greater mechanical stresses on the solder connections, particularly as the size of the chip increases, due to the different coefficients of thermal expansion of chip and substrate material upon changes in temperature. With a desired further enlargement of the chip surface and the further refinement of the conductor and connection structures, the danger of breaks in the rigid solder connections is considerably increased.

Further, in modern large size electronic devices it is necessary that components be mechanically separable into function groups so as to simplify maintenance, assure exchangeability of the groups and facilitate expansion. See, for example, A. Keil, W. A. Merl, and E. Vinaricky, *Elektrische Kontakte und ihre Werkstoffe [Electrical Contacts and Their Materials]*, published by Springer Verlag, 1984, pages 317 et seq. Mechanical separability is realized by plug-in or press-on connectors having multiple connecting elements.

If mechanical separability is to exist for the installation of individual integrated circuits, or chips, considerable concessions must be made, at the present state of the art, with respect to integration density since conventional chip carriers provided with mechanically separable connecting elements, and their associated contact bases, require an area which is a multiple of the available chip surface. The connecting elements of the chip carrier are here connected to contact locations on the chip by way of relatively long conductors, e.g. according to the wire bonding method as described by Kästner, above. Here the joining electrodes on the chip carrier may be spaced considerably farther apart than the contact locations on the chip. Only in this way is it possible to mechanically plug in and separate the multiple connecting elements for electrically joining the microelectronic components.

If particularly high integration densities are desired, which is the case, for example, in the construction of particularly fast and high powered computer systems, mechanical separability of the chip connections must be relinquished at the present state of the art.

In the "flip-chip bonding" technique described by L. S. Goldman et al, above, the exchangeability of individual chips, which is obligatory for maintenance purposes or for a later change of functions, is realized by making available a special soldering device which operates with a hot gas jet (see, for example, K. I. Puttlitz, "Chip Replacement by Hot-Gas Site Dressing", published in *Solid State Technology*, November, 1980, pages 48-50). To assure avoidance of undue temperature stresses in the substrate and to effect the necessary smoothing of old solder locations requires a significant amount of apparatus and time.

SUMMARY OF THE INVENTION

It is an object of the present invention to provide a method for producing multiple connections for electrically joining microelectronic components, with the connections being deformable within certain limits to compensate for differences in thermal expansion between chip and substrate or other similarly constructed electronic components that are to be connected together and with the connections requiring the least possible amount of space.

It is a further object of the present invention to provide a method for producing a mechanically separable connector having multiple connector elements for electrically joining microelectronic components in a manner which saves more space than known techniques.

The above and other objects are accomplished according to the invention by the provision of a method for producing a plurality of deformable connecting elements for electrically joining microelectronic components, including:

irradiating with high energy radiation portions of a plate-like member composed of material having a material characteristic which is changed by such high energy radiation, each portion having dimensions corresponding to those of a connecting element;

utilizing the changed material characteristic of the material of the irradiated portions to remove such material from the irradiated portions to produce a plate-like mold containing a plurality of mold structures each defining a shape corresponding to a connecting element at a given location of said member, each such mold structure having lateral dimensions and a height dimension which is a multiple of the smallest lateral dimension;

filling the mold structures with metal by electroplating the metal into such mold structures to produce metallic connecting elements;

fixing the connecting elements to at least one microelectronic component; and removing the plate-like mold.

The method according to the present invention makes it possible to jointly produce and fix a large number of connecting elements which are deformable within satisfactory limits and which have the extremely small dimensions and spacing required for space saving installation of microelectronic components. In spite of sufficient deformability in the plane of critical thermal expansion, the multiple connecting elements produced in this way are sufficiently rigid in the direction perpendicular to that plane to be able to absorb, for example, the contact pressure of the cooling cylinders required for the above-described cooling with water. Moreover, the multiple electrical connecting elements produced according to the present invention open up an opportunity for forced cooling by gas blown into the space created by the connecting elements between the chips and the substrate.

The above and other objects are further accomplished by the present invention which additionally provides a method for producing each part of a two-part mechanically separable connector having multiple connecting elements for electrically joining microelectronic components, including:

irradiating with high energy radiation portions of an electrically insulating plate-like member composed of material having a material characteristic which is changed by such high energy radiation, each portion having dimensions corresponding to those of a connecting element;

utilizing the changed material characteristic of the material of the irradiated portions to remove such material from the irradiated portions to form a plate-like mold containing a plurality of mold structures each defining a shape corresponding to a connecting element at a given location of the member, each such mold structure having lateral dimensions and a height dimension which is a multiple of the smallest lateral dimension;

filling the mold structures with metal by electroplating the metal into such mold structures to produce metallic connecting elements;

irradiating further parts of the plate-like mold to change the material characteristic of the material comprising such parts; and utilizing the changed material characteristic of the material of the irradiated further parts to remove the material from such further parts.

The foregoing method makes it possible to maintain the unusually close tolerances in dimensions and in mutual positions of the connecting elements required for space-saving installation at costs which are economically justified.

The invention will now be described in greater detail with the aid of the drawings.

DESCRIPTION OF THE PREFERRED EMBODIMENTS

Figure 1:
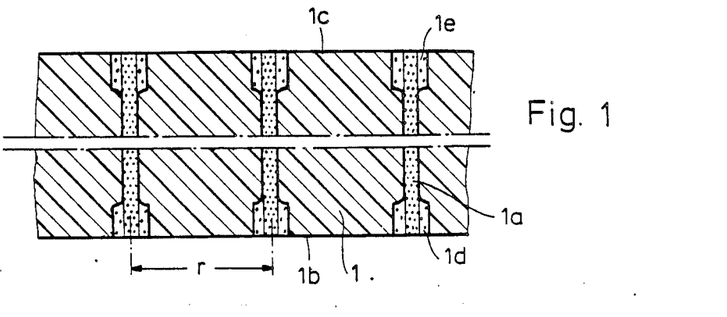
FIGS. 1 through 4 are sectional views showing schematic representations of intermediate components produced in the manufacturing method according to one embodiment of the invention.

FIG. 1 is a cross-sectional view, to a greatly enlarged scale, of a plate-shaped material of polymethylmethacrylate (PMMA), hereinafter called resist plate 1 having sides 1b and 1c. Resist plate 1 has a thickness of about 500 $\mu$m and is partially irradiated through an X-ray mask (not shown) at one of sides 1b and 1c with high energy X-rays from a conventional synchrotron (not shown) in a given raster pattern of cylindrical regions 1a having a diameter of about 30 $\mu$m and spaced apart by about 300 $\mu$m. The high energy radiation causes solubility of regions 1a to be considerably greater than that of the unirradiated regions of resist plate 1. Then the resist plate is further partially irradiated from both sides 1b and 1c in the same pattern but with a lesser penetration depth and over a diameter of about 70 $\mu$m to form soluble regions 1d and 1e.

To produce soluble regions in PMMA, the energy absorbed per unit volume must be about 1000 J/cm$^3$. Appropriate sources for irradiating PMMA resist plates with a thickness of 500 $\mu$m are installed at various locations. At DESY in Hamburg the electron storage ring DORIS can be used as a source for high energy X-rays and, at the University of Bonn, the 2.5 GeV electron synchrotron is a suitable radiation source, too.

Figure 2:
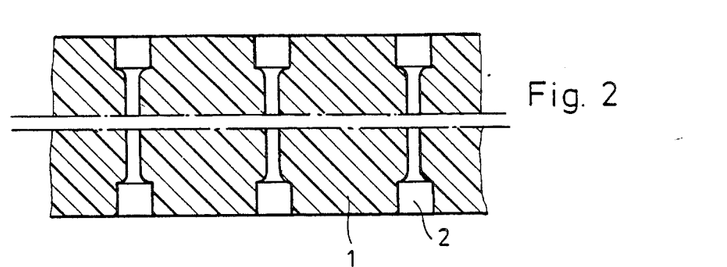
Figure 3:
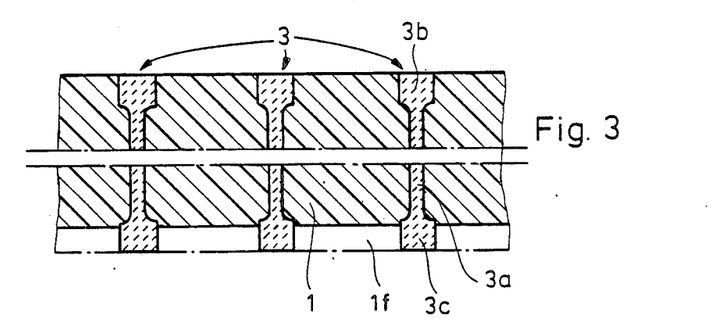

The thus irradiated, and thus made soluble, regions 1a, 1d and 1e, are removed by means of a developer as disclosed, for example in German Offenlegungsschrift [laid-open patent application] No. 3,039,110 so that a mold containing mold structures 2 having a shape corresponding to the desired connecting elements results, with these mold structures 2 having collar shaped broadened portions at their ends as shown in FIG. 2. In the next step, structures 2 are filled with nickel by electroplating, so that connecting elements 3 result which have a thinner, deformable center section 3a and thicker end regions 3b and 3c as shown in FIG. 3. As can further be seen in FIG. 3, on one side resist plate 1 has a part 1f which is removed by irradiating it with radiation of corresponding penetration depth and subsequently dissolving out the material so that the thickened end regions 3c of the connecting elements are exposed.

Figure 4:
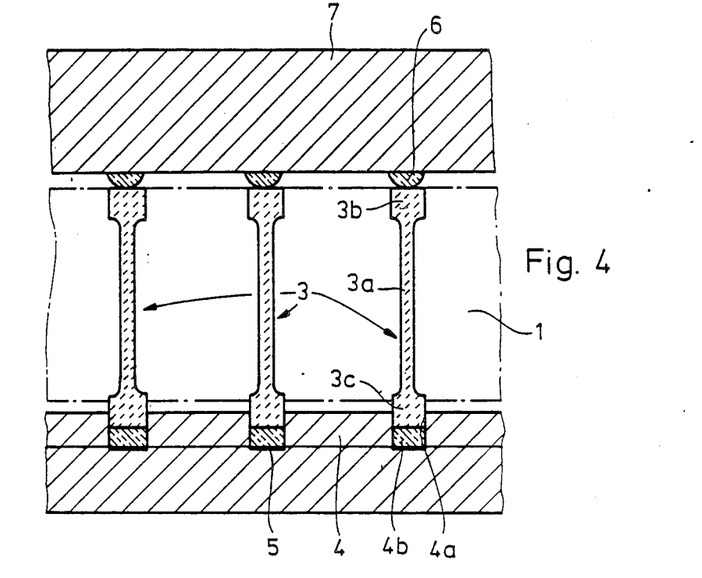

Referring to FIG. 4, the thickened end regions 3c are placed into corresponding holes 4a of a ceramic substrate plate 4 and are fixed therein. Holes 4a are partially filled with a lead/tin alloy 4b which, during later heating as described below, assures the electrical connection between connecting elements 3 and conductor paths 5 on substrate plate 4, the latter being comprised of a plurality of layers. Then the remaining material of resist plate 1 is removed by means of a solvent. Terminals 6 provided with solder beads and arranged on a chip 7 in the same pattern as thickened end regions 3b are then placed onto the thickened end regions 3b and the entire arrangement is heated in a furnace so that connecting elements 3 are soldered to conductors 5 on substrate plate 4 as well as to terminals 6.

Due to their deformable center sections 3a, connecting elements 3 are here able to compensate for differences in thermal expansion between chip 7 and substrate plate 4. Instead of the above-described type of fixation it is also possible to use the conductors 5 of substrate plate 4 as the electroplating electrode. In this case, the mold with structures 2 (see FIG. 2) is placed directly onto substrate plate 4 in such a manner that structures 2 are flush with mating holes 4a in substrate plate 4. After filling structures 2 with metal by way of electroplating, the material of resist plate 1 is removed and connecting elements 3 are soldered to terminals 6 of chip 7. In both cases, a space is created between the chip 7 and the substrate plate 4 through which a cooling gas can be blown.

Figure 5:
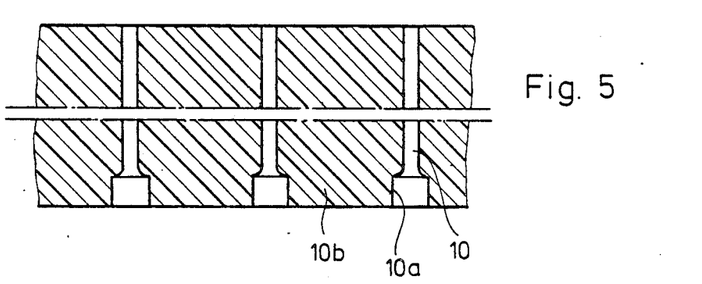
FIGS. 5 through 7 are sectional views showing schematic representations of intermediate components produced in the manufacturing method according to another embodiment of the invention.
Figure 6:
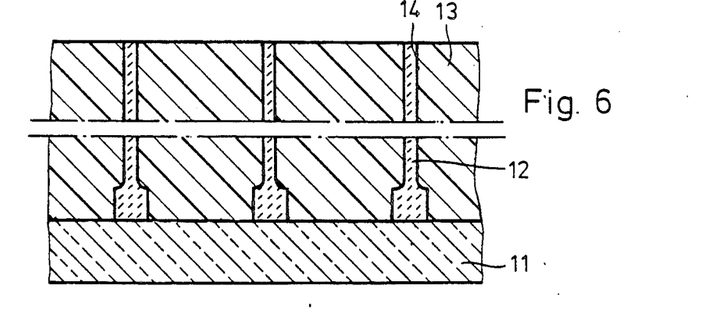

According to a further variation of the invention, the connecting elements are produced according to the so-called "molding technique", in which a mother tool is produced and repeatedly used with suitable molding material to produce secondary molds which are then filled with metal by electroplating. In this case and with reference to FIG. 5, partial irradiation and partial removal of material, analogously to that described in connection with FIG. 2, produces structures 10 in a plate-like material 10b of PMMA, with these structures, as a result of the molding process, having a thickened end region 10a only at one end. Structures 10 are filled with nickel by way of electroplating, with the electroplating electrode remaining as a holding plate 11 on the thus produced primary connecting elements 12 as shown in FIG. 6. This mother tool, composed of parts 11 and 12, with the plate-like material 10b having been removed, for example by irradiation and subsequent dissolving as previously discussed, is now repeatedly filled with a molding material 13, e.g. likewise PMMA, whose properties are changed by high energy radiation, thus producing secondary plate-shaped molds which contain structures 14 for producing juxtaposed, deformable connecting elements.

By admixing an internal mold release agent (e.g. type PAT 665 manufactured by Wurtz GmbH, Bingen, West-Germany, for PMMA) the mold material, the adhesive strength between the secondary plateshaped molds and the mother tool is strongly reduced and the mold can be removed mechanically from the tool without difficulty, i.e. no damage of the mold will occur.

Figure 7:
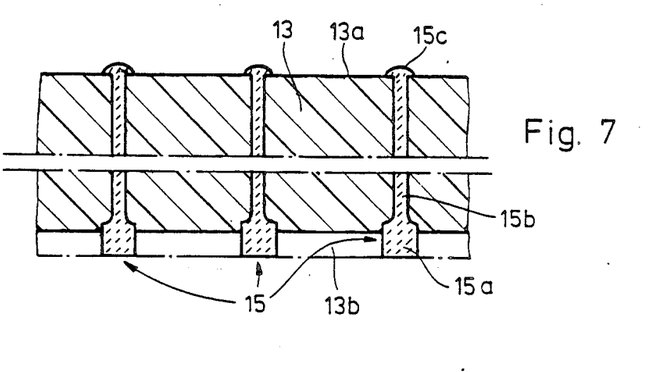

The secondary molds are now themselves filled with a metal by electroplating, for example nickel, as shown in FIG. 3 to produce the secondary connecting elements 15 as shown in FIG. 7. These secondary connecting elements 15 have a thinner, deformable region 15b and a thicker end region 15a which can be fixed in a substrate plate corresponding to FIG. 4, after part 13b of the secondary mold has been removed by irradiating it with a radiation of corresponding penetration depth and subsequently dissolving it out. By electroplating over surface 13a of the secondary mold, upper, thickened end regions 15c are obtained which are later soldered to terminals 6 of chip 7 (see FIG. 4). After fixing end regions 15a on a substrate plate, such as substrate 4 shown in FIG. 4, the remaining mold material 13 is removed.

Figure 8A:
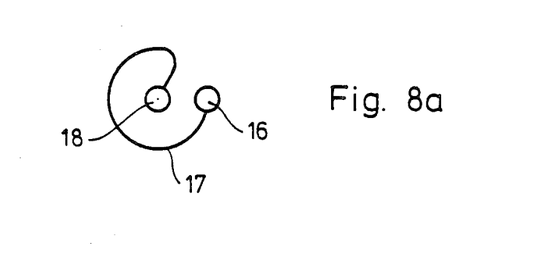
FIGS. 8a and 8b are schematics showing a variant of the connection element produced according to the method of the invention.
Figure 8B:
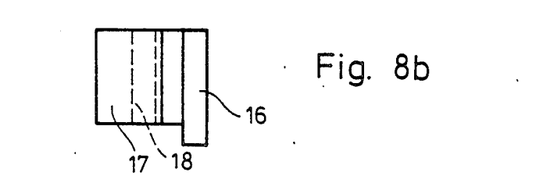

The method of the invention can be used to produce not only columnar connecting elements which have cross sections that are the same over their height or cross sections that vary, but also leaf-shaped elements having various geometries. FIGS. 8a and 8b are exemplary plan and side views, respectively, of a connecting element in which two mutually parallel arranged pins 16 and 18 are connected together by means of a thin leaf spring 17. At least one of the pins, such as pin 16 in FIG. 8b, projects beyond the height of the leaf spring. This is accomplished by subsequent galvanic extension of the pin with the use of a special mold that contains only the structure of the pin.

In the selected embodiments it was assumed that the microelectronic components to be connected are a chip and a substrate plate. Of course, other microelectronic components can be connected together in an analogous manner. It is possible, for example, to further increase the integration density of microcircuits by replacing the substrate plate shown in FIG. 4 with a further chip whch is connected with a substrate plate by way of contact locations attached to its edge.

FIGS. 9 through 12 relate to an embodiment of a mechanically separable connector having multiple connector elements produced according to the method of the invention. The connector is composed of a plug and a socket for the attachment of, for example, a chip to a substrate plate, with the numerous contact locations of the chip being distributed over the chip surface.

Figure 9A:
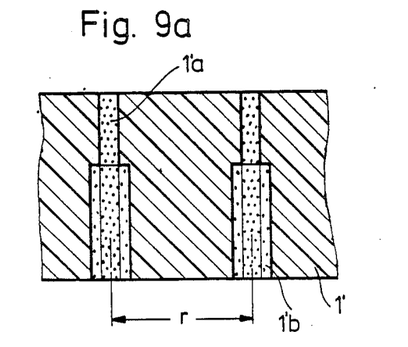
FIGS. 9a and 9b are sectional views of intermediate components formed during the manufacture of a mechanically separable connector in accordance with the method of the invention.
Figure 10A:
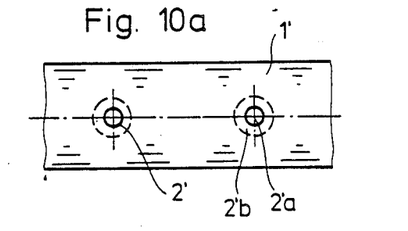
FIGS. 10a and 10b are elevational views taken from the top of FIGS. 9a and 9b, respectively.

FIGS. 9a and 9b are schematic cross-sectional views of two plate-shaped, electrically insulated materials of polymethacrylate (PMMA), hereinafter called resist plates 1' and 4', respectively. Resist plates 1' and 4' have a thickness of about 0.5 mm. Resist plate 1' is partially irradiated via an X-ray mask (not shown) from one of either the top or bottom sides in FIG. 9a with high energy X-rays from a conventional synchrotron in such a manner that cylindrical regions 1'a, each having a diameter of about 30 $\mu$m, are produced at a given raster spacing r. The solubility of these regions is much greater than that of the unirradiated regions on resist plate 1'. Then resist plate 1' is further partially irradiated from the same side, in the same pattern r, with, however, the penetration depth of the radiation being less than the thickness of the resist plate and the diameter of the irradiated regions being about 70 $\mu$m, so that a thicker and shorter cylindrical irradiated region 1'b is produced. The thus irradiated, and thus made soluble, regions 1'a, 1'b are removed by means of a liquid developer as disclosed in German Offenlegungsschrift [laid-open patent application] No. 3,039,110. This results in a mold having columnar mold structures 2' for multiple plug elements, each having a thinner section 2'a and a thicker section 2'b as shown in FIG. 10a.

Figure 9B:
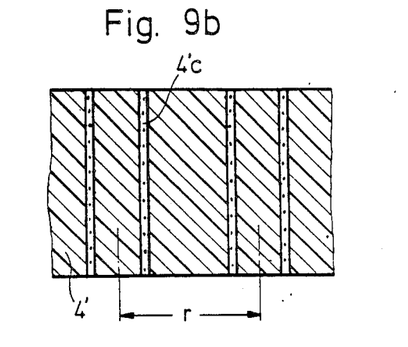
Figure 10B:
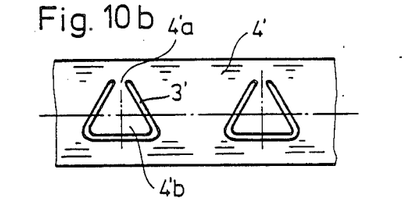
Figure 11A:
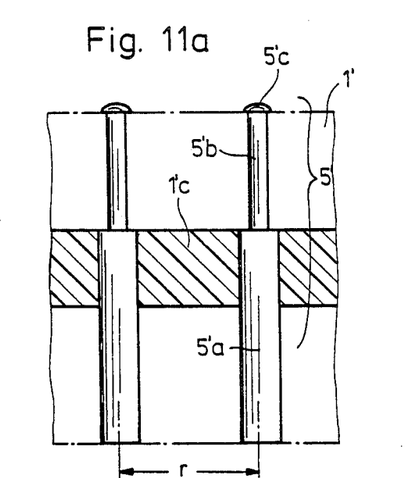
FIGS. 11a and 11b are sectional views of subsequent intermediate components of a mechanically separable connector produced according to the method of the invention.

In a corresponding manner, resist plate 4' of FIG. 9b is partially irradiated, with the irradiated regions being irradiated at the same raster spacing r and having a triangular base shape 4'c so that after removal of the material from the irradiated regions, a mold is produced as shown in FIG. 10b which contains triangular mold structures 3' for a multiple element socket. Structures 3' mate with the thicker sections 2'b of structures 2' of the multiple element plug. The structures 3' thus have the shape of hollow triangular prisms having an inner contact circle which is somewhat smaller in diameter than the diameter of the thicker section 2'b of structure 2'. Along one edge, structure 3' has an interruption 4'a so that, after removal of the material from the irradiated region, the core material 4'b remains connected with the other material of resist plate 4'. Now structures 2' and 3' are filled with nickel by electroplating. As can be seen in FIG. 11a, this produces parallel, juxtaposed columnar plug elements 5' at a raster spacing r, having thicker sections 5'a, thinner sections 5'b and lens-shaped soldering buttons 5'c procuced by electroplating over the surface (dot dash line in FIG. 11a) of resist plate 1'.

Then, resist plate 1' is irradiated from both sides with electron radiation at a given penetration depth such that non-irradiated, plate-shaped region 1'c remains in the center zone of resist plate 1' as shown in FIG. 11a. Plug elements 5' are fixed together through this unirradiated region 1'c (plug plate) of resist plate 1 and are electrically insulated from one another after the irradiated regions have been removed by dissolving them out with the above-mentioned liquid developer.

Figure 11B:
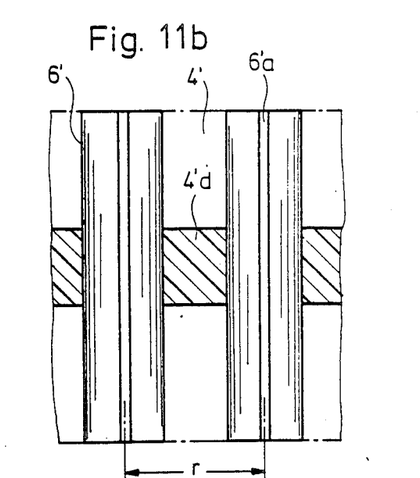

As can be seen in FIG. 11b, the filling of structures 3' by electroplating produces prismatic socket elements 6' which are parallel to one another and have a triangular cross section, longitudinal slits 6'a and the same raster spacing r as plug elements 5' in FIG. 11a. The irradiation of resist plate 4' from both sides and removal of the irradiated material takes place in a corresponding manner as for plug elements 5' so that an unirradiated, center region 4'd remains (socket plate), through which socket elements 6' are fixed together and electrically insulated against one another.

Figure 12:
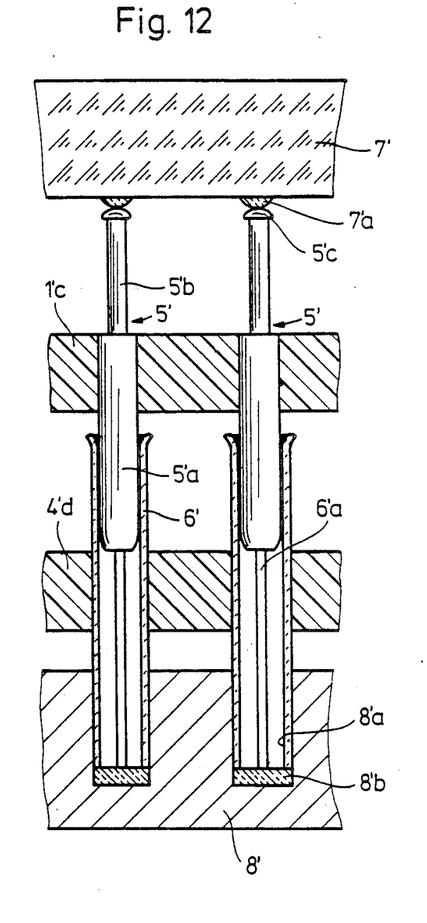
FIG. 12 is a sectional view of a mechanically separable connector produced according to the invention, showing its installation in relation to a chip and a substrate plate.

FIG. 12 is a schematic representation of a mechanically separable multiple element connector produced according to the present invention for an exemplary application. The thicker ends 5'a of plug elements 5' are inserted in socket elements 6', with the resiliently yielding side walls of the socket elements resting against the thicker ends 5'a of plug elements 5' with the required contact pressure. The lens-shaped heads 5'c of plug elements 5' are soldered to the contact locations 7'a of a chip 7'. The thinner sections 5'b can thereby be deformed in such a manner that they are able to compensate for differences in thermal expansion between chip 7' and socket plate 1'c due to temperature changes.

The ends of socket elements 6' are placed into holes 8'a of a ceramic substrate plate 8' and are there soldered to conductors 8'b of that plate. By means of slits 6'a a springloaded contact is ensured when the thicker ends 5'a of the plug elements 5' are inserted in the socket elements 6'.

That means that socket elements 6' together with socket plate 4'd form a socket base adjacent substrate plate 8' for chip 7' with its plug elements 5' soldered thereto and fixed in plug plate 1'c. The gap between chip 7' and plug plate 1'c can be utilized, during soldering as well as during operation, for the passage of a cooling gas. To facilitate introduction of the plug elements 5' into the socket elements 6', the ends of socket elements 5' facing socket elements 6' have been rounded by galvanically removing part of their material. In addition, the ends of the socket elements 6' facing plug elements 5' have been jointly opened up (outwardly flared) by means by an appropriate multiple element tool. Moreover, corresponding guide members (not shown in FIG. 12) are preferably provided at the edges of the plug and socket plates 1'c and 4'd, respectively in a manner similar to that described below in connection with FIG. 13.

Figure 13:
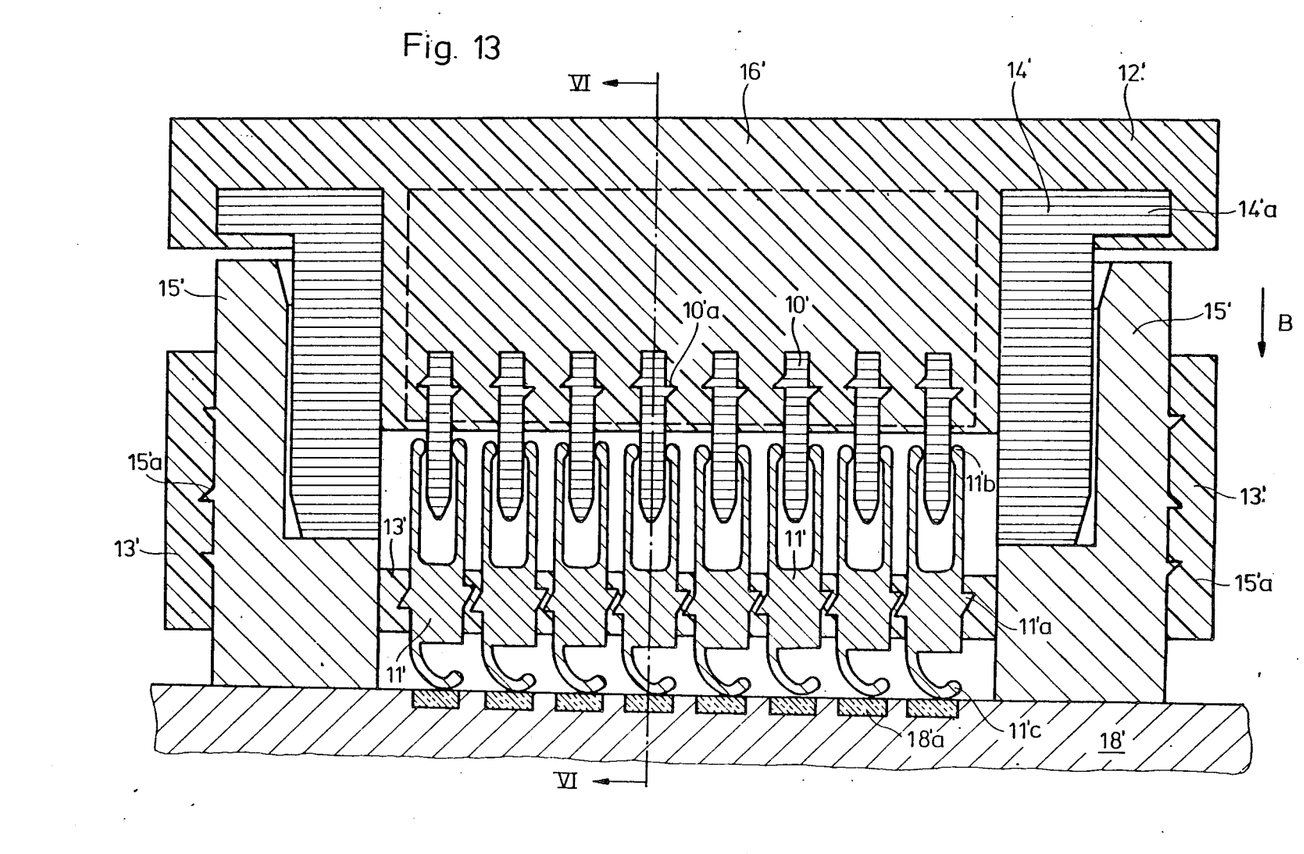
FIG. 13 is a sectional view of another embodiment of a mechanically separable connector produced in accordance with the invention.
Figure 14:
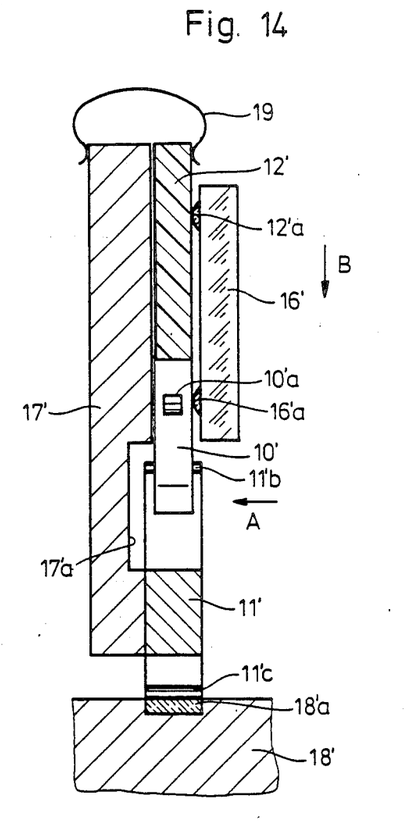
FIG. 14 is a sectional view along line VI-VI of FIG. 13.

FIGS. 13 and 14 illustrate another embodiment of a modified, mechanically separable connector which is produced according to the method of the invention and which is composed of multiple plug elements and multiple socket elements for attachment of a chip to a substrate plate, with the contact locations of the chip being disposed along one edge of the chip.

The knife edge plug elements 10' and the clamp-shaped socket elements 11' are produced by partial irradiation (irradiation direction shown by arrow A in FIG. 14) and removal of material from two PMMA resist plates and subsequent filling of the thus produced structures with a metal by electroplating in a manner similar to that discussed in connection with FIGS. 9 to 13. Metallic guide members 14' and 15' are produced simultaneously and facilitate assembly of the multiple element connector (assembly direction see arrow B). Plug elements 10', clamp-shaped socket elements 11' and guide members 14' and 15' are provided with teeth 10'a, 11'a, 14'a and 15'a so as to anchor them in the resist plates. Renewed partial irradiation and removal of material from the resist plate produces regions on elements 10', 11', 14' and 15' which define plug plate 12' and a socket plate 13'. In these plates 12' and 13', elements 10' and 11' are fixed at a given raster spacing and are electrically insulated from one another.

If another insulating material is to be employed for the plug and socket plates instead of PMMA, for example a more temperature resistant polyimide, the procedure is as follows: after the electroplating step, the regions of the PMMA resist plates intended for the plug and socket plates are initially irradiated, removed and replaced by the other insulating material; then the remaining PMMA material of the resist plates is removed by dissolving it out. The insulating polyimide material is polymerized directly on the plug and socket plates. Appropriate polyimide resins can be obtained from various manufacturers, e.g. CIBA-Geigy, Switzerland, or Hitachi, Japan.

As shown in FIG. 14, contact locations 16'a disposed along the edge of chip 16' are soldered to the knife-edge plug elements 10' which are fixed in plug plate 12'. In addition, plug plate 12' is glued to chip 16' at glue location 12'a. On its side facing away from chip 16', socket plate 13' is provided with an abutment plate 17' of an electrically insulating material which has a recess 17'a in the contacting region.

The resilient connecting lugs 11'c of socket elements 11' are soldered to conductors 18'a of substrate plate 18'. Guide members 15 here simultaneously serve as abutments on substrate plate 18' and are connected with the latter by gluing. Resilient connecting lugs 11'c smooth out any possibly existing unevennesses on conductors 18'a of substrate plate 18'.

The multiple element plug composed of parts 10', 12' and 14' is introduced from the top in the direction of arrow B into a multiple element socket composed of parts 11', 13' and 15', with the ends 11'b of the clamp-shaped socket elements 11' assuring the necessary contact pressure. Plug plate 12' is additionally held against abutment plate 17' by a bar-type clip 19 (FIG. 14) that can be placed over it.

The perpendicular arrangement of chip 16' with respect to substrate plate 18' permits the realization of a particularly high integration density.

Figure 15:
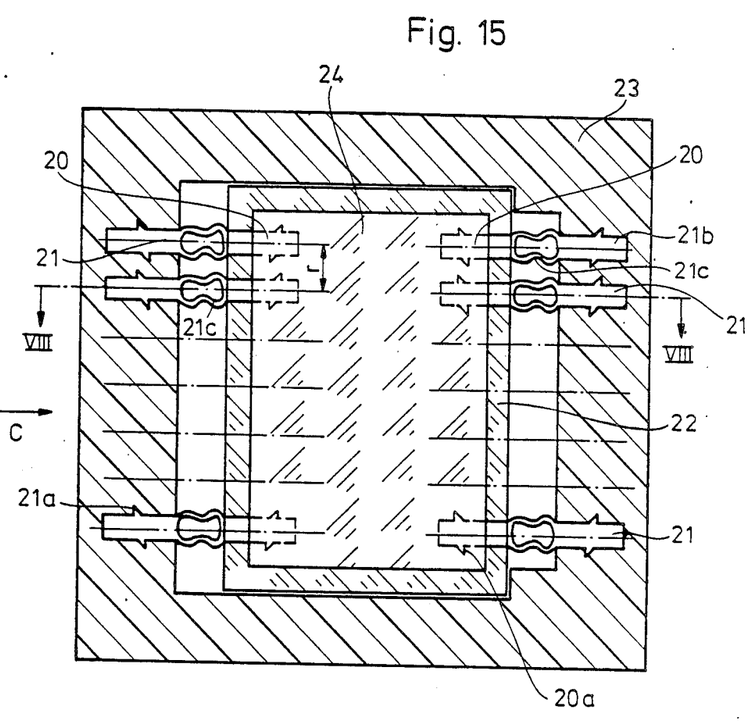
FIG. 15 is a sectional view in partial elevation showing a further variation of a mechanically separable connector made in accordance with the invention.
Figure 16:
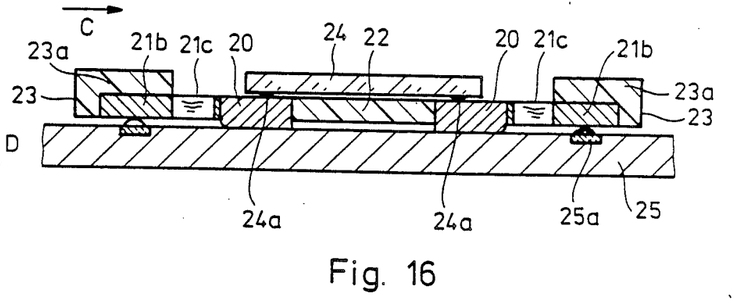
FIG. 16 is a sectional view along line VIII—VIII of FIG. 15.

FIGS. 15 and 16 illustrate yet another mechanically separable multiple element connector which is made according to the principles of the present invention and which is used for connecting a chip to a substrate plate, with the contact locations on the chip being arranged along facing edges of the chip.

Rigid connecting elements 20 having a block-shaped basic outline and resilient connecting elements 21 are produced by partial irradiation and removal of material from two resist plates and subsequent filling the thus produced structures with a metal by electroplating. Then regions of the resist plates, which are intended for the fixation of the elements 20 and 21, are irradiated and dissolved out. The dissolved out resist material is replaced by another electrically insulating material such as a suitable epoxy resin.

Suitable epoxy resins can be obtained from CIBA-Geigy, Switzerland. Brand names of such resins are Araldit and Aralcast.

Then the remaining resist material is removed, so that the contact regions of connecting elements 20 and 21 are exposed. In this way, a chip carrier plate 22 and an epoxy resin frame 23 surrounding it are produced, with connecting elements 20 and 21 being embedded in frame 23 in a given raster pattern having a raster spacing of r. As can be seen in FIG. 16, the epoxy resin of frame 23 may cover one side of elements 21. Elements 20, 21 are provided with teeth 20a and 21a. The facing rows of contact locations 24a of chip 24 are soldered to the rigid connecting elements 20 on chip carrier plate.

The resilient connecting elements 21 in frame 23 are soldered to conductors 25a of substrate plate 25. Resilient connecting elements 21 each have a region 21b which is embedded in the epoxy resin of frame 23 and is followed by a region 21c intended for contacting. Region 21c has the shape of an open figure eight, so that a spring effect is produced in the direction of arrow C.

Chip 24, together with chip carrier plate 22, is pushed from the top into frame 23, with the spring direction (arrow C) extending perpendicularly to the direction of insertion arrow D). This causes the free resilient ends 21c of elements 21 to press against the contacting faces of the rigid connecting elements 20.

To protect the chip during assembly and disassembly, the chip carrier plate 22 may be provided with a frame which surrounds the chip and serves as a handle. This frame may additionally be filled with a plastic to embed the chip.

In a further aspect of the present method, the connecting elements, produced by electroplating, constitute primary connecting elements and are fixed on a common holding plate which is formed by electroplating over the height of the resist plate.

After removal of the resist material, a mother tool is obtained which is composed of the primary connecting elements and the holding plate and which is used repeatedly to form secondary molds from a casting resin on a methacrylate basis. The thus produced mold structures in the solidified, plate-like molding material of the secondary mold are then filled by electroplating in the prescribed manner to produce secondary connecting elements, whereupon those parts of the secondary mold which lie in the region of the secondary connecting elements intended for contacting are removed by renewed partial irradiation and dissolving out the molding material.

In this latter aspect of the invention it is of course also possible to replace the molding material remaining for mutual fixing of the connecting elements (plug plate and socket plate, respectively) by another insulating material, e.g. polyimide, as described above.

The above described, mechanically separable, multiple element connectors can be used to advantage not only for joining chips but likewise for joining other microelectronic components, such as, for example, sensor arrays or liquid crystal displays.

It will be understood that the above description of the present invention is susceptible to various modifications, changes and adaptations, and the same are intended to be comprehended within the meaning and range of equivalents of the appended claims.

What is claimed is:

1. Method for producing a plurality of deformable connecting elements for electrically joining microelectronic components, comprising:

irradiating with high energy radiation portions of a plate-like member composed of material having a material characteristic which is changed by such high energy radiation, each portion having dimensions corresponding to those of a connecting element;

utilizing the changed material characteristic of the material of the irradiated portions to remove such material from the irradiated portions to produce a plate-like mold containing a plurality of mold structures each defining a shape corresponding to a connecting element at a given location of said member, each such mold structure having lateral dimensions and a height dimension which is a multiple of the smallest lateral dimension;

filling the mold structures with metal by electroplating the metal into such mold structures to produce metallic connecting elements;

fixing the connecting elements to at least one microelectronic component; and removing the plate-like mold.

2. Method as defined in claim 1, wherein said irradiating step includes employing synchrotron radiation as the high energy radiation and said utilizing step includes using a liquid developer to effect removal of the irradiated material.

3. Method as defined in claim 1, wherein said removing step includes irradiating further parts of the plate-like mold with high energy radiation to change the material characteristic of the material thereof and utilizing the changed material characteristic to effect removal of the further parts of the plate-like mold.

4. Method as defined in claim 1, wherein said filling step includes using an electroplating electrode to effect the electroplating; and said fixing step includes using the electroplating electrode as a substrate plate and fixing the connecting elements to the substrate plate.

5. Method as defined in claim 1, wherein said irradiating step is effected in several successive steps with different regions of the plate-like member being irradiated with radiations having different penetration depths.

6. Method as defined in claim 5, wherein said irradiating step is effected to produce irradiated portions corresponding to connecting elements each having at least one end region with a larger cross section than in the remaining region of said connecting element.

7. Method as defined in claim 1, wherein said fixing step includes fixing the connecting elements to a microelectronic component comprising a substrate plate.

8. Method for producing a plurality of deformable connecting elements for electrically joining microelectronic components, comprising:
- irradiating with high energy radiation portions of a plate-like member composed of material having a material characteristic which is changed by such high energy radiation, each portion having dimensions corresponding to those of a connecting element;
- utilizing the changed material characteristic of the material of the irradiated portions to remove such material from the irradiated portions to produce a plate-like mold containing a plurality of mold structures each defining a shape corresponding to a connecting element at a given location of said member, each such mold structure having lateral dimensions and a height dimension which is a multiple of the smallest lateral dimension;
- filling the mold structures with metal by electroplating the metal into such mold structures to produce metallic connecting elements;
- fixing the connecting elements to a holding plate;
- removing the plate-like mold, said connecting elements so fixed constituting primary connecting elements;
- molding the primary connecting elements in a molding material to produce a secondary plate-like mold containing secondary mold structures corresponding to deformable connecting elements;
- filling the secondary plate-like mold with a metal by electroplating metal into the secondary mold structures to produce secondary connecting elements;
- fixing the secondary connecting elements to a microelectronic component; and
- removing the secondary plate-like mold.

9. Method as defined in claim 8, wherein said molding step includes using a molding material having a material characteristic which changes when such molding material is irradiated with high energy radiation and said step of removing the secondary plate-like mold includes irradiating further parts of the molding material with high energy radiation to change the material characteristic thereof and utilizing the changed material characteristic of the further parts to effect removal thereof.

10. Method as defined in claim 8, wherein said step of filling the secondary plate-like mold includes using an electroplating electrode to effect the electroplating and said step of fixing the secondary connecting elements includes using the electroplating electrode as a substrate plate and fixing the secondary connecting elements to the substrate plate.

11. Method as defined in claim 8, wherein said irradiating step is effected in several successive steps with different regions of the plate-like member being irradiated with radiations having different penetration depths.

12. Method for producing a plurality of deformable connecting elements for electrically joining microelectronic components, comprising:
- irradiating with high energy radiation portions of a plate-like member composed of an electrically insulating material having a material characteristic which is changed by such high energy radiation, each portion having dimensions corresponding to those of a connecting element;
- utilizing the changed material characteristic of the material of the irradiated portions to remove such material from the irradiated portion to produce a plate-like mold containing a plurality of mold structures each defining a shape corresponding to a connecting element at a given location of said member;
- filling the mold structure with metal by electroplating the metal into such mold structure to produce metallic connecting elements;
- fixing the connecting elements to at least one microelectronic component; and
- removing the plate-like mold.

13. Method as defined in claim 12, including effecting said irradiating, utilizing and filling steps to produce connecting elements each in the form of a leaf spring; and wherein said fixing step includes connecting each leaf spring to a respective one of mutually parallel arranged pairs of electrically conductive pins.

14. Method for producing each part of a two-part mechanically separable connector having multiple connecting elements for electrically joining microelectronic components, comprising:
- irradiating with high energy radiation portions of an electrically insulating plate-like member composed of material having a material characteristic which is changed by such high energy radiation, each portion having dimensions corresponding to those of a connecting element;
- utilizing the changed material characteristic of the material of the irradiated portions to remove such material from the irradiated portions to form a plate-like mold containing a plurality of mold structures each defining a shape corresponding to a connecting element at a given location of the member, each such mold structure having lateral dimensions and a height dimension which is a multiple of the smallest lateral dimension;
- filling the mold structures with metal by electroplating the metal into such mold structures to produce metallic connecting elements;
- irradiating further parts of the plate-like mold to change the material characteristic of the material comprising such parts; and
- utilizing the changed material characteristic of the material of the irradiated further parts to remove the material from such further parts.

15. Method as defined in claim 14, wherein said irradiating steps include using synchrotron radiation as the high energy radiation and said utilizing steps include using a liquid developer to effect removal of the material.

16. Method as defined in claim 14, including effecting said irradiating and utilizing steps so that regions of the connecting elements intended for contacting are exposed.

17. Method as defined in claim 14, including effecting said step of irradiating further parts and said step of utilizing the changed material characteristic of the material of the irradiated further parts so that regions of the connecting elements are exposed for mutually fixing the connecting elements relative to one another; filling such regions with another electrically insulating material which assures the mutual fixing of the connecting elements relative to one another; and removing the remaining portions of the mold 18. Method for producing each part of a two-part mechanically separable connector having multiple connecting elements for electrically joining microelectronic components, comprising:
- irradiating with high energy radiation portions of an electrically insulating plate-like member composed of material having a material characteristic which is changed by such high energy radiation, each portion having dimensions corresponding to those of a connecting element;
- utilizing the changed material characteristic of the material of the irradiated portions to remove such material from the irradiated portions to form a primary plate-like mold containing a plurality of mold structures each defining a form corresponding to a connecting element at a given location of the member, each such mold structure having lateral dimensions and a height dimension which is a multiple of the smallest lateral dimension;
- filling the mold structures with metal by electroplating the metal into such mold structures to produce primary metallic connecting elements;
- fixing the primary metallic connecting elements to a holding plate;
- removing the remaining material of the plate-like member;
- molding the primary connecting elements in an electrically insulating material having a material characteristic which is changed by high energy radiation to produce a secondary mold containing a plurality of mold structures corresponding to connecting elements;
- filling the mold structures of the secondary mold with metal by electroplating metal into such mold structures to produce secondary metallic connecting elements;
- irradiating parts of the secondary mold with high energy radiation to change the material characteristic of the material of such parts; and
- utilizing the changed material characteristic of the material of the irradiated parts to remove such material from the secondary mold.

19. Method as defined in claim 18, including effecting said step of irradiating parts of the secondary molds and said step of utilizing the changed characteristic of the material of the irradiated parts so that regions are exposed for mutually fixing the secondary connecting elements relative to one another; and filling such regions with another electrically insulating material which assures the mutual fixing of such secondary connecting elements relative to one another.

20. Method as defined in claim 18, wherein said irradiating steps include using synchrotron radiation as the high energy radiation and said utilizing steps include using a liquid developer to effect removal of the material.

21. Method as defined in claim 18, including effecting said irradiating and utilizing steps with respect to the secondary mold so that regions of the secondary connecting elements intended for contacting are exposed.

* * * * *